United States Patent
Watanabe et al.

(10) Patent No.: US 6,902,418 B2
(45) Date of Patent: Jun. 7, 2005

(54) SELF-ALIGNING SOCKET CONNECTOR

(75) Inventors: Toshiaki Watanabe, Tokyo (JP); Manabu Doi, Dazaifu (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/483,692

(22) PCT Filed: Jul. 12, 2002

(86) PCT No.: PCT/US02/22225
§ 371 (c)(1),
(2), (4) Date: Jan. 13, 2004

(87) PCT Pub. No.: WO03/007431
PCT Pub. Date: Jan. 23, 2003

(65) Prior Publication Data
US 2004/0171292 A1 Sep. 2, 2004

(30) Foreign Application Priority Data
Jul. 13, 2001 (JP) .................................. 2001-213097

(51) Int. Cl.[7] ..................... H01R 11/22; H01R 13/62; H01R 12/00; H05K 1/00
(52) U.S. Cl. ..................... 439/266; 439/331; 439/70
(58) Field of Search ................... 439/266, 331, 439/72, 73, 330, 525

(56) References Cited

U.S. PATENT DOCUMENTS

| 4,691,975 A | * | 9/1987 | Fukunaga et al. | 439/266 |
| 5,067,904 A | * | 11/1991 | Takeuchi et al. | 439/73 |
| 5,443,396 A | * | 8/1995 | Tokushige | 439/266 |
| 6,533,595 B2 | * | 3/2003 | Yamada | 439/266 |

* cited by examiner

Primary Examiner—Chandrika Prasad
(74) Attorney, Agent, or Firm—Robert J. Zeitler

(57) ABSTRACT

Disclosed is an improved IC socket comprising a socket body having a seat surface formed its compartment, on which seat surface an IC package can be put, terminals aligned in confronting relation and mounted in the socket body, each terminal has a contact portion to make contact or engage with a selected lead of the IC package, and an actuator member for displacing the contact portions of the terminals between the withdrawing position in which the contact portions of the terminals are apart from the seat surface of the socket body and the advancing position in which the contact portions of the terminals are so close to the seat surface of the socket body as to permit the contact portions to engage with the leads of the IC package. The contact portion of each terminal comprises a first contact element having an engagement surface confronting the upper surface of the lead and a second contact element having an oblique engagement surface confronting the lower edge of the end of the lead. With this arrangement the IC package can be automatically put in centering position relative to the terminals of the socket.

15 Claims, 6 Drawing Sheets

PRIOR ART

PRIOR ART

SELF-ALIGNING SOCKET CONNECTOR

FIELD OF THE INVENTION

The present invention relates to an IC socket having a plurality of terminals projecting from its opposite longitudinal sides for engaging with the leads of an IC package.

BACKGROUND OF THE INVENTION

An IC socket having a plurality of terminals to make contact or engage with the leads of an IC package is used in carrying out a variety of tests including a burn-in test. There are a variety of IC sockets such as shown in Unexamined Patent Publication Nos. 9-266024, 10-50441, 11-54233 and other publications. Such an IC socket comprises a socket body having a seat surface formed therein, on which seat surface an IC package can be put, a plurality of terminals aligned in confronting relation and mounted in the socket body, each terminal has a contact portion to engage with a selected lead of the IC package, and an actuator member for displacing the contact portions of the terminals between the withdrawing position in which the contact portions of the terminals are apart from the seat surface of the socket body and the advancing position in which the contact portions of the terminals are so close to the seat surface of the socket body as to permit the contact portions to engage with the leads of the IC package.

Referring to FIG. 9, in a conventional IC socket a socket body 102 has a seat surface 103 formed therein, on which seat surface 103 an IC package 101 can be put. A plurality of terminals 105 are arranged in confronting relation to be mounted in the socket body 102. Each terminal 105 has a contact portion 107 to engage with a selected lead 106 of an IC package 101. A cover-like actuator member 108 is put on the socket body 102 for displacing the contact portions 107 of the terminals 105 between the withdrawing position in which the contact portions 107 of the terminals 105 are apart from the seat surface 103 of the socket body 102 and the advancing position in which the contact portions 107 of the terminals 105 are so close to the seat surface 103 of the socket body 102 as to permit the contact portions 107 to make contact or engage with the leads 106 of the IC package 101.

The socket body 102 has an IC package compartment formed therein. The seat surface 103 is formed in the compartment, which is sized to accommodate the largest possible IC package 101. As a consequence there may appear a gap between either longitudinal side of the IC package and the confronting longitudinal side wall of the compartment when an IC package of standard size or minimum allowance, and such gap is a cause for making incomplete terminal-and-lead contact in putting the IC package in the compartment.

As seen from FIG. 9, the IC package is so displaced rightward as to allow the left leads 106 of the IC package to leave apart from the contact portions 107 of the left terminals, thus allowing the IC package 101 to incline relative to the seat surface 103. Referring to FIG. 10(a), the IC package is put closer to the left longitudinal side than the right longitudinal side of the compartment. In this position each right lead 106 is pushed against the contact portion 107 of the counter terminal so forcedly that the lead 106 may be deformed more or less, or that incomplete wiping or unstable contact may be caused. On the contrary the left lead 106 of the IC package is almost apart from the contact portion 107 of the counter terminal, thereby causing incomplete contact between the lead 106 and the terminal 107, as seen from FIG. 10(b).

SUMMARY OF THE INVENTION

One object of the present invention is to provide an IC socket which is free of the adverse effects caused by the inevitable appearance of the gap between either longitudinal side of the compartment and the leads of the IC package. To attain this object an IC socket is so designed according to the present invention that the IC package may be automatically put in the center position when it is put on the seat surface of the compartment of the socket body.

Specifically an IC socket comprising a socket body having a seat surface formed in its IC package compartment, on which seat surface an IC package can be put, a plurality of terminals aligned in confronting relation and mounted in the socket body, each terminal having a contact portion to make contact or engage with a selected lead of the IC package, and an actuator member for displacing the contact portions of the terminals between the withdrawing position in which the contact portions of the terminals are apart from the seat surface of the socket body and the advancing position in which the contact portions of the terminals are so close to the seat surface of the socket body as to permit the contact portions to engage with the leads of the IC package, is improved according to the present invention in that the contact portion of each terminal comprises a first contact element having an engagement surface confronting the upper surface of the lead and a second contact element having an oblique engagement surface confronting the lower edge of the end of the lead. The oblique engagement surface of the second contact element may be a slope rising in the withdrawing direction.

The plurality of terminals may be arranged to confront laterally in one direction or laterally and longitudinally in two or crosswise directions.

With the arrangement as described above the IC package can be self-aligned to put itself in the center position through the agency of the contact portions of the terminals, thus allowing the leads of the IC package to confront the terminals of the socket body. Thus, it is assured that complete lead-to-terminal contact be made, and that no significant deformation be caused on leads.

BRIEF DESCRIPTION OF THE ACCOMPANYING DRAWINGS

The organization and manner of the structure and operation of the invention, together with further objects and advantages thereof, may best be understood by reference to the following description, taken in connection with the accompanying drawings, wherein like reference numerals identify like elements in which.

Figure 9:
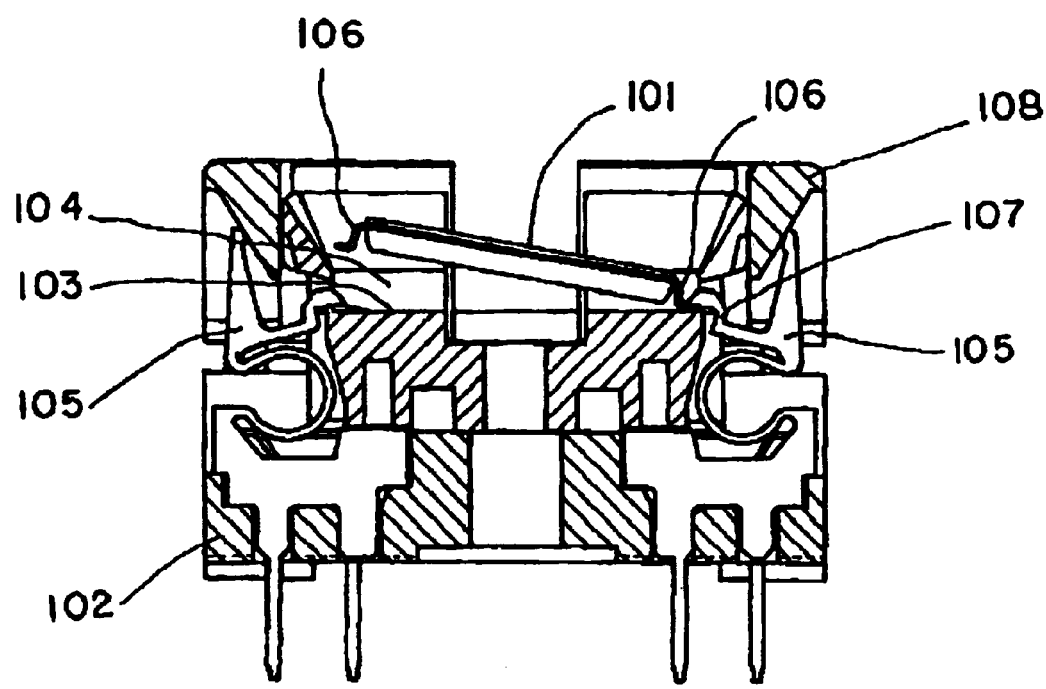
Figure 10A:
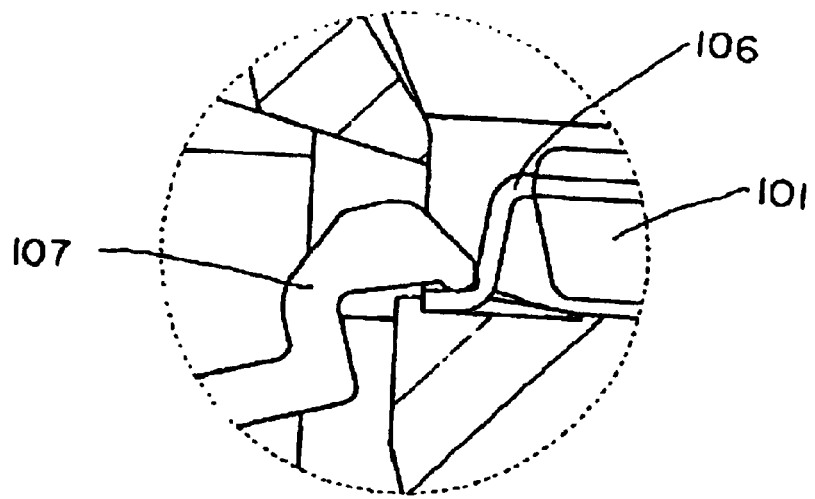
Figure 10B:
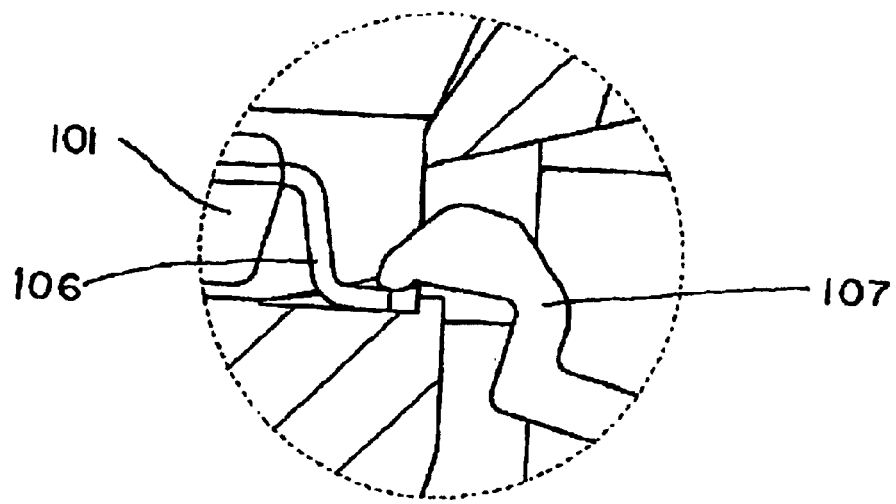

FIG. 9 is a cross section of a conventional IC socket, showing an IC package as being inclined in its compartment; and FIG. 10(a) illustrates how each left lead of the IC package is positioned relative to the counter contact portion of the terminal when the IC package is displaced leftward, and FIG. 10(b) illustrates how each right lead of the IC package is positioned relative to the counter contact portion of the terminal.

DESCRIPTION OF PREFERRED EMBODIMENTS

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 1:
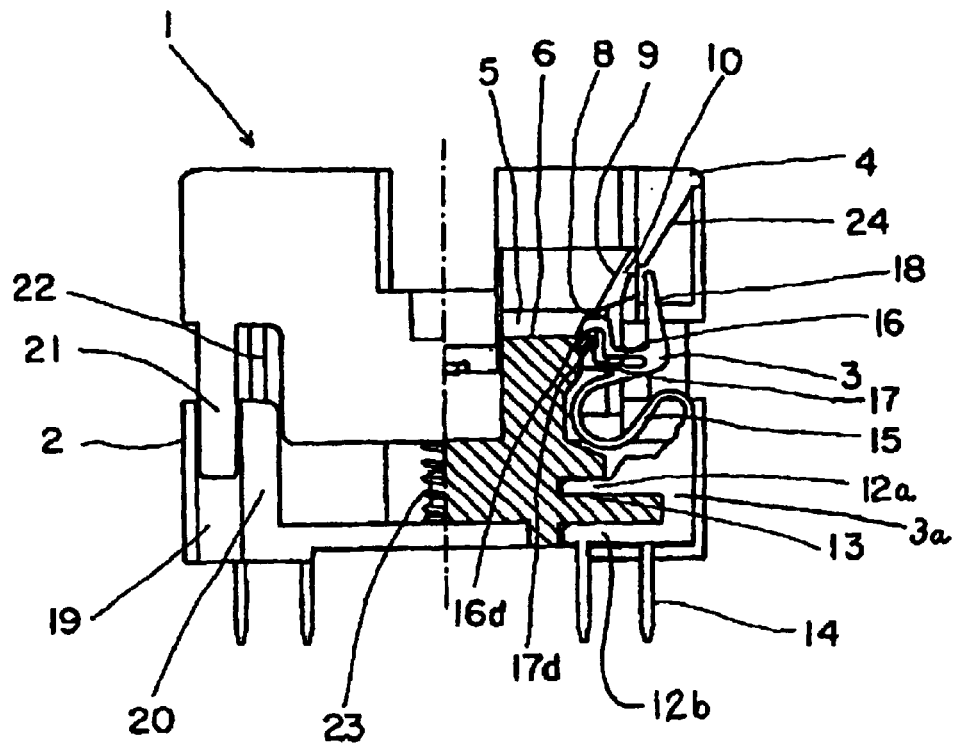
FIG. 1 is a front view of a self-aligning IC socket according to the present invention, partly in section.

Referring to FIG. 1, an IC socket 1 according to one embodiment of the present invention comprises a socket body 2 having a plurality of terminals 3 mounted therein, and a cover-like actuator 4 for actuating the terminals 3 against the leads of an IC package. The socket body 2 has a compartment 5 formed therein. The floor of the compartment 5 provides a seat surface 6 for an IC package. The IC package 7 (see FIG. 3) is put in the compartment 5, so that it may be laid on the seat surface 6 with its leads engaged with terminals 3 of the socket 1. As seen from the drawing, the compartment 5 has opposite oblique-and-vertical walls to define a down-converging (or up-diverging) space. The converging slopes 9 function to lead an IC package to the bottom space defined by the opposite vertical wall sections, which work as a guide for leading and putting the IC package in correct position. The distance between the vertical wall sections 8 is equal to the largest lateral allowance for manufacture of IC packages.

One group of terminals 3 are arranged at regular intervals along the longitudinal lower edge of one of the vertical wall sections 8 whereas another group of terminals 3 are arranged at regular intervals along the longitudinal lower edge of the other vertical wall section 8. These terminals 3 are arranged at same intervals as the leads of the IC package. Each terminal 3 comprises a vertical stem 3a, two horizontal branches 12a, 12b integrally connected to one side of the vertical stem, two tails 14 integrally connected to the lower horizontal branch, a generally AS@-shaped piece 15 integrally connected to the top of the vertical stem, a contact portion integrally connected to the end of the AS@-shaped piece 15 and a vertical actuator piece 18 integrally connected to the end of the AS@-shaped piece 15. The contact portion has first and second contact elements 16 and 17, which are long enough to extend beyond the vertical wall section 8 when the terminal 3 is fixed to the socket body 2 by inserting the upper branch 12a of the terminal 3 into the terminal slot made on either longitudinal side of the socket body 2. The terminals 3 are fixed to the opposite longitudinal sides of the socket body 2 so that their contact portions may confront laterally in the compartment 5.

The cover 4 is movably fixed to the socket body 2. Specifically the socket body 2 has a guide slot 19 and a guide post 20 formed on either side. Likewise, the cover 4 has a guide post 21 and a guide slot 22 formed on either longitudinal side. The cover 4 and the socket body 2 are mated together by inserting the guide post 20 of the socket body 2 and the guide post 21 of the cover 4 in the guide slot 22 of the cover 4 and the guide slot 19 of the socket body 2 respectively, thereby permitting the cover 4 to be raised or lowered relative to the socket body 2. A spring 23 is put between the socket body 2 and the cover 4 to keep the cover 4 raised all the time.

Diverging surfaces 24 are formed on the opposite longitudinal sides of the top of the cover 4. When the cover 4 is pushed down against the counter force applied by the spring 23, the diverging surfaces 24 push the vertical actuator pieces 18 of the terminals 3 outward, and accordingly the AS@-shaped pieces 15 of the terminals 3 are yieldingly bent so that the first and second contact elements 16 and 17 may be withdrawn backward.

Figure 2:
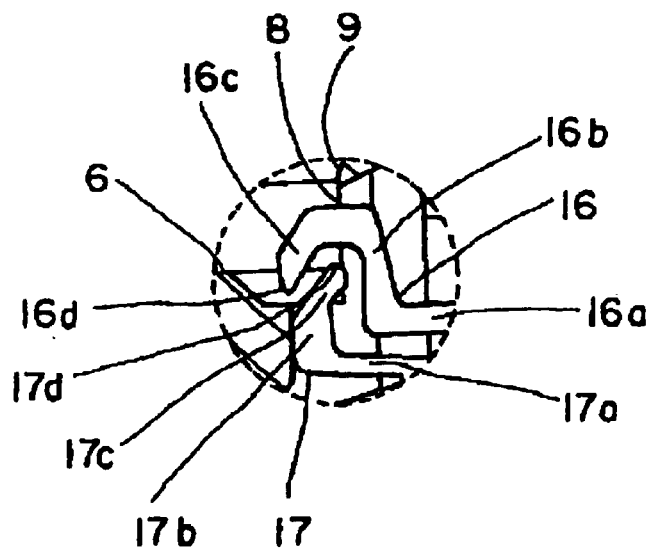
FIG. 2 is an enlarged view of the contact portion of the terminal used in the self-aligning IC socket of FIG. 1.

As seen from FIG. 2, the first contact element 16 comprises a horizontal extension 16a, an inverted AL@-shaped riser 16b integrally connected to the horizontal extension 16a and an outward-oblique piece 16c integrally connected to the inverted AL@-shaped riser 16b. The outward-oblique piece 16c provides a flat engagement plane 16d to confront the upper surface of the end of a selected lead 11 in an IC package 7.

The second contact element 17 comprises a horizontal extension 17a, an upright riser 17b integrally connected to the horizontal extension 17a and an inward-oblique piece 17c integrally connected to the upright riser 17b. The inward-oblique piece 17c is parallel to the outward-oblique piece 16c, and the inward-oblique piece 17c provides an oblique engagement plane 17d to confront the lower surface of the end of the selected lead 11. As seen from FIG. 2, the outward-oblique piece 16c of the first contact element 16 and the inward-oblique piece 17c of the second contact element 17 extend beyond the vertical guide wall section 8 in the compartment 5.

Figure 3:
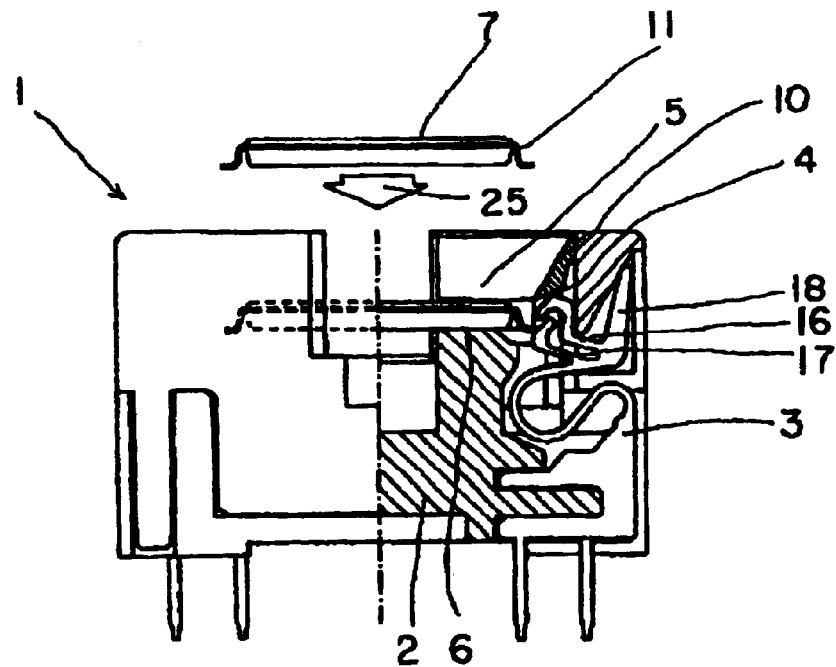
FIG. 3 is similar to FIG. 1, but showing the self-aligning IC socket with its cover pushed down, thereby permitting the socket to be loaded with an IC package.

Referring to FIG. 3 and subsequent drawings, the manner in which an IC package 7 can be put in the compartment of the socket body 2 with the leads 11 of the IC package 7 engaged with the terminals 3 of the socket 1 is described.

Figure 4:
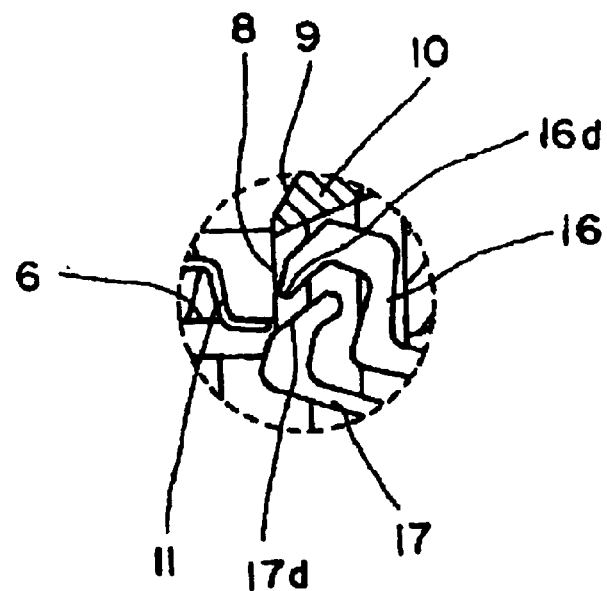
FIG. 4 is another enlarged view of the contact portion of the terminal.
Figure 5:
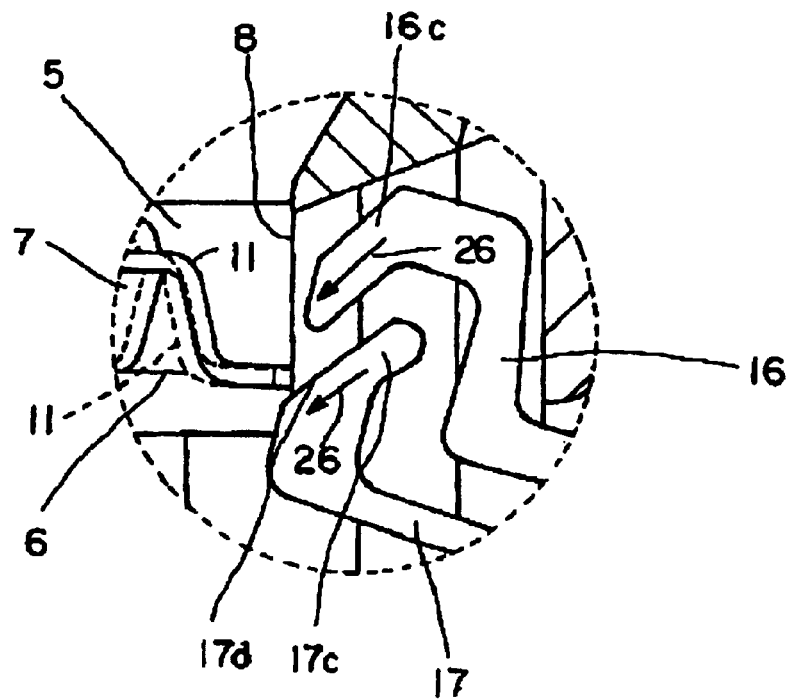
FIG. 5 is still another enlarged view of the contact portion of the terminal.

First, the cover 4 is pushed down to displace the contact portions of the terminals 3 backward to their withdrawing positions (see FIGS. 3, 4 and 5). Then, the IC package 7 is put in the compartment 5 by hand or by an automatic loading machine, as indicated by the arrow 25. The IC package 7 falls on the seat surface 6, allowing its leads 11 to slide on the opposite guide walls 8 in the compartment 5.

As seen from FIG. 5, the IC package 7 is displaced apart from the centering position so that the right leads 11 of the IC package 7 abut against the right vertical wall section 8 (solid lines), and accordingly the left leads 11 of the IC package 7 are apart from the left vertical wall section 8. In FIG. 5 the right leads 11 of the IC package 7 are shown in phantom lines when the IC package 7 is put in the centering position.

After putting the IC package 7 in the compartment the cover 4 is released by removing the pushing force from the cover 4, allowing the spring 23 to raise the cover 4, and at the same time, allowing the terminals 3 to return their contact portions to the initial stress-free positions. Then, required electric connections are made between the terminals 3 of the IC socket 1 and the leads 11 of the IC package 7.

Figure 6:
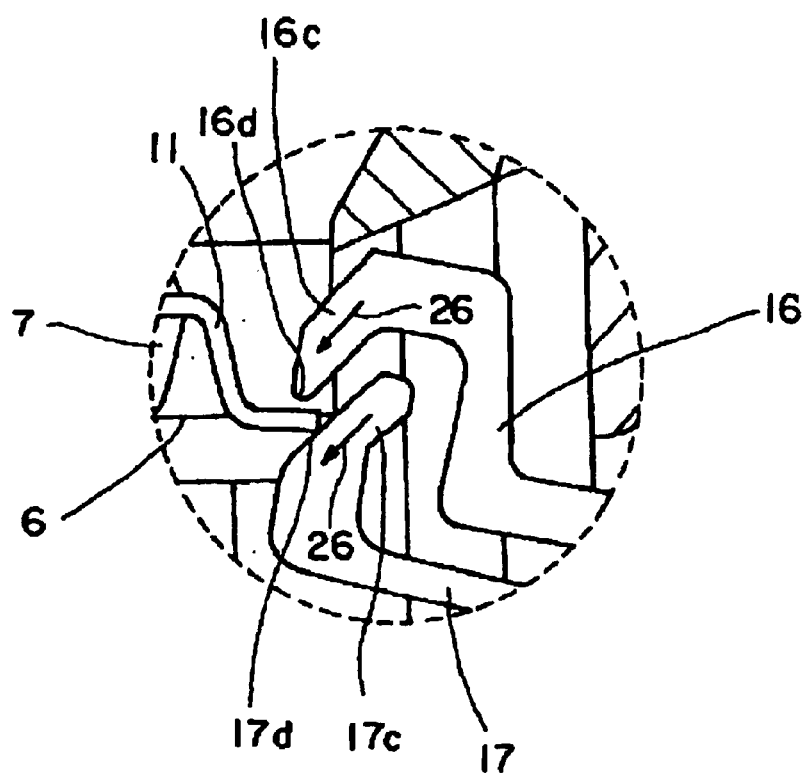
FIG. 6 is still another enlarged view of the contact portion of the terminal, showing how the contact portion behaves when the cover is on the way to its original upper position.

On the way to the initial stress-free position the outward-oblique piece 16c of the first contact element 16 and the inward-oblique piece 17c of the second contact element 17 of the contact portion of each terminal 3 are moved in the direction indicated by the arrow 26 in FIGS. 5 and 6. Specifically, the oblique engagement plane 17d of the inward-oblique piece 17c of the second contact element 17 abuts on the lower edge of the end of the counter lead 11, thus allowing the second contact element 17 to drive the IC package 7 leftward, reducing the space between the left vertical wall section 8 and the left lead 11 until the oblique engagement plane 17d of the inward-oblique piece 17c of the second contact element 17 on the left side of the IC package 7 abuts on the lower edge of the end of the left lead 11. Thus, the IC package 7 can be automatically put in the centering position, as seen from FIG. 6. Movement of the contact portion of each terminal to its initial position continues, allowing the oblique engagement plane 17d of the inward-oblique piece 17c of the second contact element 17 to wipe the lower edge of the end of the lead 11.

Figure 7:
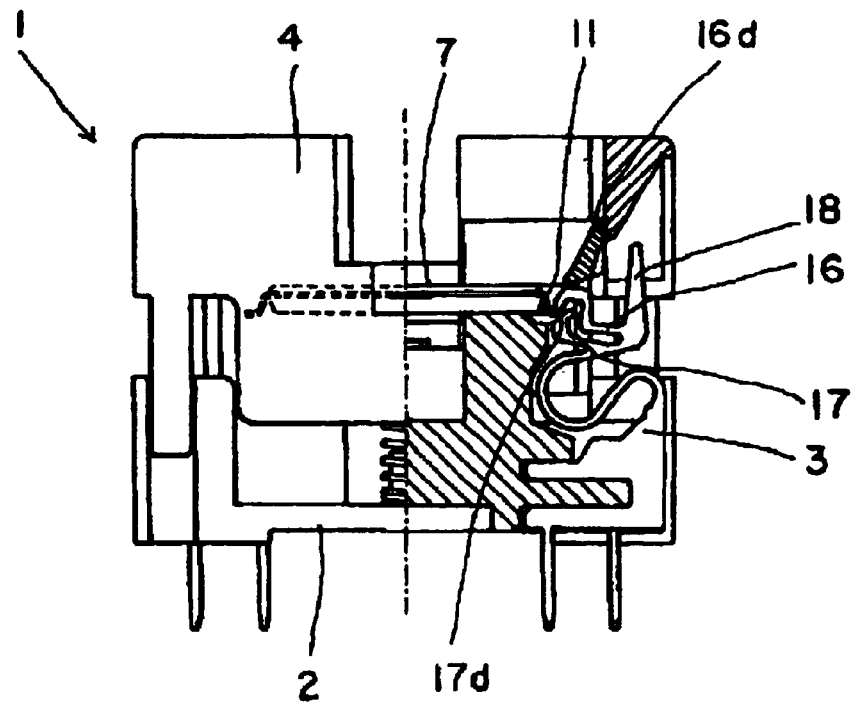
FIG. 7 is similar to FIG. 3, but showing the self-aligning IC socket with its cover raised, retaining the IC package in its compartment.
Figure 8:
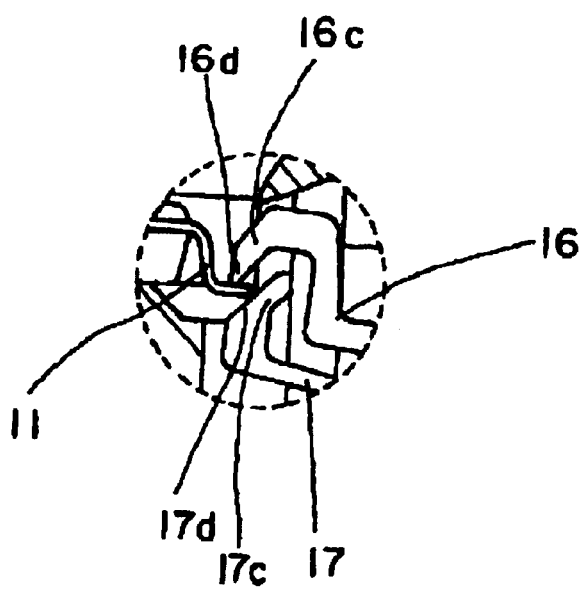
FIG. 8 is still another enlarged view of the contact portion of the terminal, showing how the contact portion behaves when the IC package is put on the seat surface of the compartment with its leads engaged with the contact portions of the terminals.

The oblique engagement plane 17d of the inward-oblique piece 17c of the second contact element 17 applies a raising force to the lead 11 whereas the flat engagement plane 16d of the outward-oblique piece 16c of the first contact element 16 applies a lowering force to the lead 1. In the contact-making position. (see FIG. 7) the wiped surfaces of the lead 11 are pinched between the first and second contact portions 16 and 17 of each terminal 3 under pressure appropriate for the purpose, thus assuring that a reliable electric contact be made between the lead 11 and the terminal 3.

In the IC socket described above the socket body 2 has terminals 3 mounted on its opposite longitudinal sides to confront laterally in one direction, and is appropriate for use in accommodating a small outline package or thin small outline package. Terminals 5 may be mounted on its four sides to confront crosswise so that the IC socket may be used in accommodating a quad flat pack package.

As may be understood from the above, a self-aligning IC socket uses terminals each having a first contact element to engage with the up per surface of the lead and a second contact element to engage with the lower end edge of the lead, thereby allowing these contact elements to wipe the lead and drive the IC package to the centering position, and allowing them to pinch the wiped lead strong enough to make a reliable electric contact between the terminal and the lead.

While a preferred embodiment of the present invention is shown and described, it is envisioned that those skilled in the art may devise various modifications of the present invention without departing from the spirit and scope of the appended claims.

What is claimed is:

1. A socket connector for an IC package, the IC package including a plurality of leads, the socket connector comprising:

a socket body, the socket body including a seat surface for receiving the IC package;

a plurality of terminals aligned in confronting relation and mounted in the socket body, each terminal including a contact portion to contact a lead of the IC package, the contact portion of each terminal including a first contact element having an engagement surface confronting the lead and a second contact element having an engagement surface confronting the lead, wherein the second contact element engagement surface is an inward oblique surface.

2. The socket connector of claim 1, wherein the first contact engagement surface is generally planar.

3. The socket connector of claim 1, including an actuator member for displacing the contact portions of the terminals between a withdrawing position in which the contact portions of the terminals are apart from the seat surface of the socket body and an advancing position in which the contact portions of the terminals are so close to the seat surface of the socket body as to permit the contact portions to engage with the leads of the IC package.

4. The socket connector of claim 1, wherein the oblique engagement surface of the second contact element is a slope rising in the withdrawing direction.

5. The socket connector of claim 1, wherein the plurality of terminals are arranged to confront laterally in one direction.

6. The socket connector of claim 1, wherein the first contact element includes an engagement surface for confronting an upper surface of the lead.

7. The socket connector of claim 1, wherein the second contact element oblique engagement surface confronts a lower edge of the lead.

8. The socket connector of claim 1, wherein the socket body is generally square and the plurality of contacts are arrange on each side of the square.

9. The socket connector of claim 1, wherein vertical walls extend upwardly from the seat surface.

10. The socket connector of claim 9, wherein the first contact element extends beyond the vertical wall in a direction away from the seat surface when the terminal is in the withdrawing position.

11. The socket connector of claim 3, wherein the actuator member includes a surface that displaces the first contact element away from the seat surface when the actuator member is in the withdrawing position.

12. The socket connector of claim 1, wherein the socket body includes converging walls that converge toward the vertical walls.

13. The socket connector of claim 1, wherein the socket body includes converging walls that converge toward the seat surface.

14. The socket connector of claim 3, wherein the socket body includes a guide slot for receiving a guide post located on the actuator member.

15. The socket connector of claim 3, wherein the socket body includes a guide post to be received within a guide slot located on the actuator member.

* * * * *